(12) United States Patent
Schmollngruber et al.

(10) Patent No.: US 7,095,596 B2
(45) Date of Patent: Aug. 22, 2006

(54) MAGNETORESISTIVE SENSOR ELEMENT AND METHOD FOR REDUCING THE ANGULAR ERROR OF A MAGNETORESISTIVE SENSOR ELEMENT

(75) Inventors: Peter Schmollngruber, Aidlingen (DE); Ingo Herrmann, Leinfelden-Echterdingen (DE); Henrik Siegle, Leonberg (DE); Hartmut Kittel, Weissach-Flacht (DE); Paul Farber, Stuttgart (DE); Ulrich May, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/535,475

(22) PCT Filed: Oct. 9, 2003

(86) PCT No.: PCT/DE03/03339

§ 371 (c)(1),
(2), (4) Date: Oct. 6, 2005

(87) PCT Pub. No.: WO2004/048986

PCT Pub. Date: Jun. 10, 2004

(65) Prior Publication Data

US 2006/0152218 A1 Jul. 13, 2006

(30) Foreign Application Priority Data

Nov. 27, 2002 (DE) .................................. 102 55 327

(51) Int. Cl.
*G11B 5/33* (2006.01)
*G11B 5/127* (2006.01)

(52) U.S. Cl. .................................. 360/324; 360/324.11

(58) Field of Classification Search ..... 360/324–324.2, 360/326
See application file for complete search history.

(56) References Cited

FOREIGN PATENT DOCUMENTS

| DE | 195 32 674 | 11/1996 |
|----|------------|---------|
| DE | 197 42 366 | 5/1999 |
| DE | 198 43 349 | 3/2000 |
| DE | 199 49 714 | 4/2001 |
| DE | 101 38 757 | 3/2003 |
| WO | WO 00/79298 | 12/2000 |
| WO | WO 03/107025 | 12/2003 |

*Primary Examiner*—Ramon M. Barrera
(74) *Attorney, Agent, or Firm*—Kenyon & Kenyon LLP

(57) ABSTRACT

A magnetoresistive sensor element is provided, having a magnetoresistive layer system which, in top view, is at least regionally striated. The sensor element operates on the basis of the GMR effect and is constructed according to the spin valve principle, the striated layer system featuring a reference layer having a direction of magnetization substantially uninfluenced by a direction of an outer magnetic field acting on it. During operation, the sensor element provides a measuring signal which changes as a function of a measurement angle between the component of the field strength of the outer magnetic field lying in the plane of the layer system, and the direction of magnetization, and from which this measurement angle is able to be ascertained. In addition, observed in a top view of the striated layer system, the angle between the direction of magnetization in the absence of the outer magnetic field and the longitudinal direction of the striated layer system is set in such a way that in response to an influence of the outer magnetic field having a defined field strength, which is selected from a predefined work interval, the angle error of the layer system, as a function of this angle and the field strength, is minimal.

15 Claims, 2 Drawing Sheets

MAGNETORESISTIVE SENSOR ELEMENT AND METHOD FOR REDUCING THE ANGULAR ERROR OF A MAGNETORESISTIVE SENSOR ELEMENT

FIELD OF THE INVENTION

The present invention relates to a magnetoresistive sensor element and a method for reducing the angle error of a magnetoresistive sensor element.

BACKGROUND INFORMATION

Because of their enlarged measuring range of 360° and enlarged signal amplitudes and thus lower susceptibility to interference compared to AMR angle sensors, magnetoresistive sensor elements based on the GMR (giant magneto resistance) effect according to the so-called spin valve principle are increasingly being utilized for angle detection in motor vehicles. To that end, the sensor system has a field-generating magnet and an angle sensor, or more generally a magnetoresistive sensor element, positioned in proximity thereto, the direction of the magnetic field acting on this sensor element being detected.

The design of magnetoresistive sensor elements on the basis of the spin valve principle differs from GMR sensor elements or GMR multilayers, which have an alternating sequence of ferromagnetic and non-magnetic thin layers, to the effect that as a rule, only two ferromagnetic thin layers are provided that are separated by a non-magnetic intermediate layer. The direction of the magnetization of one of these two ferromagnetic layers is then fixed (pinned) by a coupling of this layer to an anti-ferromagnetic layer. The other layer, the so-called free layer or detection layer, in an outer magnetic field is able to freely rotate the direction of its magnetization, so that an angle, variable via the direction of the outer magnetic field, sets in between the direction of the magnetization in the detection layer and the direction of the magnetization in the pinned layer, i.e., the so-called reference layer. The electrical resistance of the sensor element is moreover a function of this angle, so that this angle can be determined by measuring the electrical resistance.

Alternatively, a layer system having an anti-ferromagnetic layer, a ferromagnetic layer situated thereon, a non-magnetic layer on it, and a ferromagnetic layer thereon, is also suitable for fixing the direction of the magnetization of the reference layer, the non-magnetic layer between the two ferromagnetic layers imparting an anti-ferromagnetic coupling between them. Such a layer system is known as an artificial anti-ferromagnet.

To permit implementation of an angle sensor having magnetoresistive layer systems operating on the basis of the GMR effect and constructed according to the spin valve principle, it is beneficial to interconnect a plurality of such magnetoresistive layer systems in two Wheatstone bridge circuits, one bridge being rotated by 90°, for example, compared to the other with respect to the direction of the magnetization in the reference layer. In an outer rotating magnetic field, for instance, this leads to a phase shift in the output signals of both bridges. One speaks here of a "cosine" bridge and a "sine" bridge according to the dependence of the output signal of the two bridges on the outer magnetic-field direction. Each of the individual Wheatstone bridges is further made up of magnetoresistive layer systems in the form of four single resistors, which pairwise have a direction of magnetization in the reference layer of, for example, 180° relative to each other.

Published international patent document WO 00/79298 provides an overview of the design of magnetoresistive layer systems that are constructed according to the spin valve principle and operate according to the GMR effect. Also described in this patent document is the interconnection of magnetoresistive layer systems in the form of two Wheatstone bridge circuits rotated by 90° relative to each other, as well as the structure of a magnetoresistive layer system having an artificial anti-ferromagnet for setting a fixed direction of the magnetization of the reference layer of the layer system.

Measuring errors due to two intrinsic effects occur when working with magnetoresistive layer systems that operate on the basis of the GMR effect and are constructed according to the spin valve principle.

Thus, the detection layer or free layer has a certain anisotropy on one hand, and on the other hand, a residual coupling with the reference layer or pinned layer, i.e., it does not optimally follow the outer magnetic field with respect to its direction. Moreover, one also observes that the direction of the magnetization of the reference layer does not remain completely unchanged when an outer magnetic field acts on it. In this respect, a slight change in the direction of the magnetization of the reference layer also frequently occurs in response to the influence of an outer magnetic field, which invalidates the measuring result.

An object of the present invention is to provide a magnetoresistive sensor element having a reduced angle error compared to the known art, and a method for reducing the angle error of a magnetoresistive sensor element, to thus permit use of this magnetoresistive sensor element as a particularly precise angle sensor, e.g., in motor vehicles.

SUMMARY

The magnetoresistive sensor element of the present invention and the method of the present invention for reducing the angle error of a magnetoresistive sensor element have the advantage that the angle error of the layer system as a function of the angle between the magnetization direction of the reference layer in the absence of an outer magnetic field and the longitudinal direction of the striated layer system, and as a function of the field strength of the magnetic field acting from outside, is minimal. In particular, it is possible to achieve angle errors of less than 0.5°, especially less than 0.2°.

Thus, it is particularly advantageous if, in addition to the suitable selection of the angle between the magnetization direction in the reference layer in the absence of the outside field and the longitudinal direction of the striated layer system, as well as the suitable selection of the field strength of the outer magnetic field, to further minimize the angle error, one also changes the width of the striated layer system, and thus in each case matches the indicated angle and the width of the striated layer system to the magnetic field, acting upon the sensor element during operation of the latter, whose strength is selected from a predefined work interval. The angle error is therefore minimized as a function of these variables.

This procedure utilizes the fact that, by skillful utilization of microscopic energy terms, it is possible to minimize the intrinsic effects that occur when using magnetoresistive sensor Elements according to the spin valve principle and that lead to measuring errors.

Thus, one such important effect or energy contribution is the shape anisotropy which occurs when structuring the magnetoresistive layer system in strips. Therefore, the angle error of the magnetoresistive layer system may be minimized by skillful utilization of the shape anisotropy, for example, of a meander-shaped printed circuit trace, which is made up of individual strip-shaped sections, in combination with a suitable selection of the pinning direction of the reference layer of the layer system in this striated region, as well as taking into account the outer magnetic-field strengths acting on the sensor element during its operation.

Therefore, an especially small angle error results, given a suitable combination of the layout of the magnetoresistive layer system in plan view, above all with respect to the width of the individual strip-shaped layer-system sections, and the direction of the magnetization of the reference layer, i.e., the so-called pinning direction, in these individual strip-shaped sections, as well as in simultaneous view of the amount of the outer magnetic field acting on the magnetoresistive sensor element during operation.

It is particularly advantageous that, by structuring the magnetoresistive layer system in strip-shaped sections having a preferred width in the range of 1 µm to 20 µm, the energy contribution of the shape anisotropy, given certain angles between the longitudinal direction of the strip and the pinning direction, i.e., the direction of the magnetization of the reference layer in the absence of an outer magnetic field or in the case of a negligibly weak outer magnetic field, has a positive influence on the angle error.

Thus, it is particularly advantageous if this angle between the magnetization direction in the absence of the outer magnetic field and the longitudinal direction of the striated layer system is at least approximately 0°, 90°, 180° or 270°, the field strength of the outer magnetic field advantageously being selected from a work interval of 0.8 kA/m to 80 kA/m, particularly 8 kA/m to 30 kA/m.

In this connection, it is further advantageous if the layout of the magnetoresistive sensor element is selected in such a way that to the greatest extent possible, all strip-shaped sections of the layer system (in plan view) have only one common direction between the longitudinal direction of the striated layer system in this area and the pinning direction.

In addition, it is advantageous if the sections of the magnetoresistive sensor element not meeting this condition are bridged or electrically short-circuited by a conducting layer exhibiting good electroconductivity, e.g., a coating of aluminum, or if these sections of the magnetoresistive sensor element are implemented from corresponding sections exhibiting good electroconductivity.

It is also advantageous if the striated layer system (in plan view) is in the form of a meander having strip sections running regionally in parallel, the magnetization directions of the reference layer of the parallel strip sections being oriented at least approximately parallel to one another, and strip sections running not parallel, but rather running perpendicularly to these strip sections being provided with this conducting layer.

Moreover, it is especially advantageous if the striated, magnetoresistive layer system has an artificial anti-ferromagnet to stabilize the direction of the magnetization of the reference layer. This results in a particularly good and stable stipulation of the magnetization direction of the reference layer.

DETAILED DESCRIPTION

Figure 4:
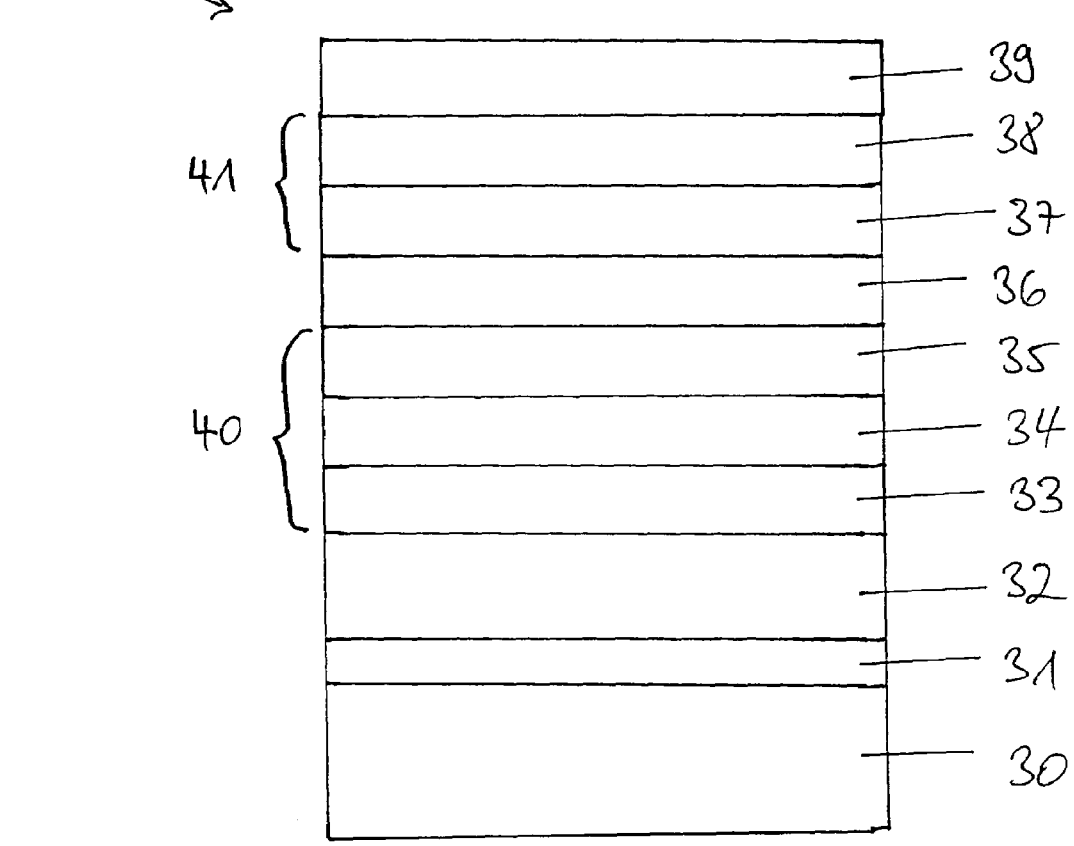
FIG. 4 shows a cross-sectional view of a section through a magnetoresistive layer system according to FIG. 3.

FIG. 4 shows a magnetoresistive layer system 10 which, in plan view, at least regionally has a strip-type structure. To that end, provided on a customary substrate 30 is a growth layer or a buffer layer 31, on which an anti-ferromagnetic layer 32 is situated. Disposed on this layer 32 is a layer system in the form of an artificial anti-ferromagnet 40 having a first fixed layer 35, i.e., a "pinned" layer or a reference layer, an intermediate layer 34 and a second fixed layer 33. Situated on artificial anti-ferromagnet 40 is a metallic layer 36, and on it a detection layer 41 made up of a first sublayer 37 and a second sublayer 38 is provided. Finally, a customary cover layer 39 made, e.g., of tantalum is located on detection layer 41.

First fixed layer 35 is made of a first ferromagnetic material, e.g., a CoFe alloy such as $Co_{90}Fe_{10}$. Second fixed layer 33 is made of a second ferromagnetic material, e.g., likewise a CoFe alloy such as $Co_{90}Fe_{10}$. Intermediate layer 34 is made of a non-magnetic material, e.g., ruthenium. The thickness of first fixed layer 35 is less, e.g., by 0.2 nm to 0.8 nm, particularly by 0.2 nm to 0.4 nm, than the thickness of second fixed layer 33. Anti-ferromagnetic layer 32 may be made of a PtMn alloy such as $Pt_{50}Mn_{50}$. Metallic layer 36 may be a copper layer. First sublayer 37 of detection layer 41 adjacent to metallic layer 36 may be made of a CoFe alloy such as $Co_{90}Fe_{10}$, and second sublayer 38 may be made of a NiFe alloy like $Fe_{19}Ni_{81}$.

The anti-ferromagnetic layer 32 has a thickness of 20 nm to 40 nm, e.g., 30 nm; second fixed layer 33 has a thickness of 2 nm to 4 nm, e.g., 2.4 nm; intermediate layer 34 has a thickness of 0.6 nm to 0.8 nm, e.g., 0.7 nm; first fixed layer 35 has a thickness of 1 nm to 3.5 nm, e.g., 2 nm; metallic layer 36 has a thickness of 1 nm to 4 nm, e.g., 2 nm; first sublayer 37 has a thickness of 0.5 nm to 2 nm, e.g., 1 nm; and second sublayer 38 has a thickness of 1.5 nm to 5 nm, especially 3 nm.

The layer structure according to FIG. 4 achieves the result that reference layer 35 has a direction of magnetization at least approximately uninfluenced by a direction of an outer magnetic field acting on it, provided the magnetic field is selected from a predefined work interval. Moreover, detection layer 41 has a direction of magnetization which is at least approximately constantly parallel to the direction of a component of the field strength of an outer magnetic field, the component lying in the plane of layer system 10.

Figure 3:
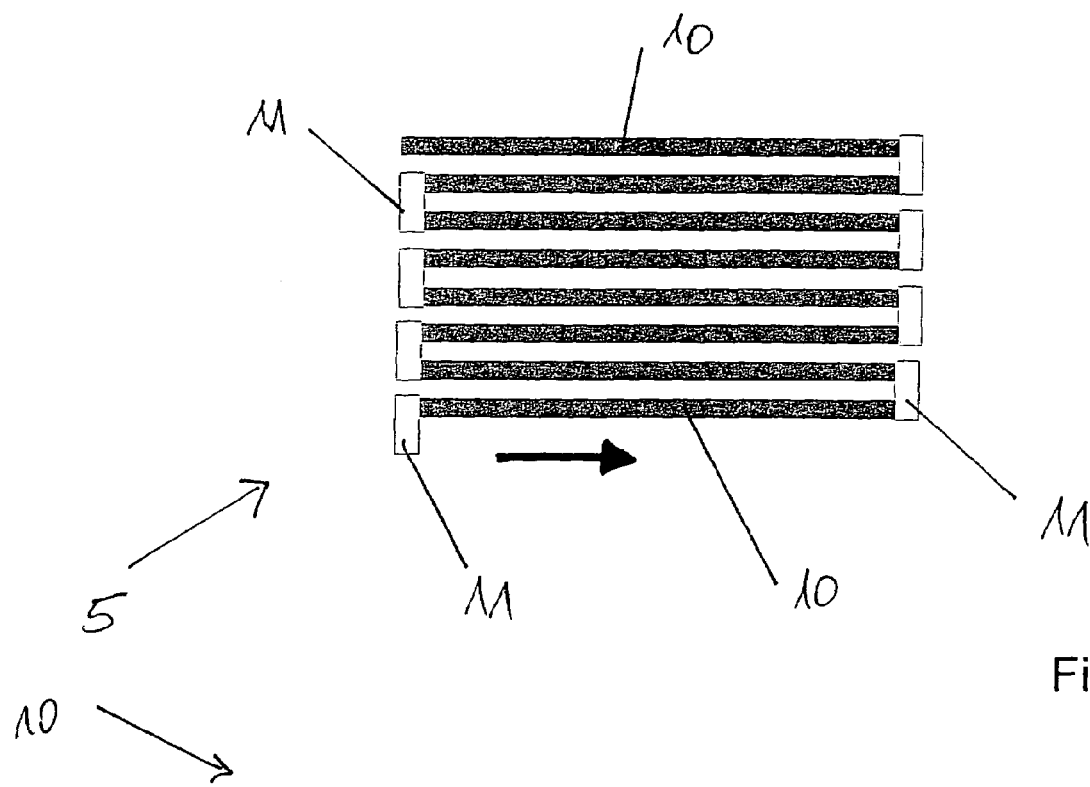
FIG. 3 shows a plan view of a meander-type layer system having short-circuit bars provided regionally.

FIG. 3 shows a top view of the layer system of FIG. 4, it being discernible that striated layer system 10 is constructed in particular in the form of a meander having strip sections running regionally in parallel. Moreover, in this context, the magnetization directions of reference layers 35 of these individual parallel-running strip sections are likewise oriented at least approximately parallel to each other. In addition, striated layer system 10 has strip parts that regionally run perpendicular to the parallel-running strip sections, and are covered by a conducting layer 11. This conducting layer 11 is a layer having particularly good electrical conductivity, especially a coating of aluminum, which runs parallel to the strip parts in question and therefore electrically short-circuits or bridges them. Alternatively, these strip parts may also be made of the material of conducting layer 11, so that they regionally connect the strip sections running side-by-side, analogous to FIG. 3.

FIG. 3, by way of the drawn-in bold arrow, indicates the uniform direction of the magnetization of reference layers 35 in individual striated layer systems 10 running parallel to one another. The structure according to FIG. 3 forms a magnetoresistive sensor element 5 which may be interconnected in the form of Wheatstone bridge circuits and built up to form an angle sensor.

The angle error of magnetoresistive layer systems on the basis of the GMR effect according to the spin valve principle—this angle error being defined as the difference of the angle between the outer-magnetic-field component lying in the plane of the layer system and the magnetization direction of the reference layer of the layer system given a negligibly weak outer magnetic field, and the measurement angle, ascertained from the measuring signal, between the outer-magnetic-field component lying in the plane of the layer system and the magnetization direction of the reference layer—is dominated by microscopic energy terms of the individual layers of layer system 10.

In the ideal case, the angle error should be 0°, i.e., the direction of the magnetization of reference layer 35 should be completely uninfluenced by an outer magnetic field, and the direction of the magnetization of detection layer 41 should always completely follow this outer magnetic field and be aligned in parallel with respect to it.

In practice, however, as a result of the anisotropy of detection layer 41, as well as a ferromagnetic or antiferromagnetic residual coupling between detection layer 41 and reference layer 35, detection layer 41 does not follow the outer magnetic field in completely free fashion.

Above all, the shape anisotropy is an essential parameter in order to reduce the angle error, since the strength of this anisotropy can be adjusted by the selection of the width of the individual strips in layer system 10, and the directional dependency of this shape anisotropy can be adjusted by the angle between the longitudinal direction of this strip and the direction of magnetization of the reference layer.

Thus, given a predefined magnetic field, by changing the strip width and the angle between the longitudinal direction of the strip and the direction of magnetization of the reference layer, these energy terms may be optimally adapted to the specific layer system 10.

The indicated energy terms can be formally integrated into the Stoner-Wohlfahrth model of magnetism and calculated, given a predefined outer magnetic field which has been selected from a customary work interval for magnetoresistive sensor elements of 0.8 kA/m (corresponding to 1 mT) to 80 kA/m (corresponding to 100 mT), e.g., from a range of 8 kA/m to 30 kA/m.

Figure 1:
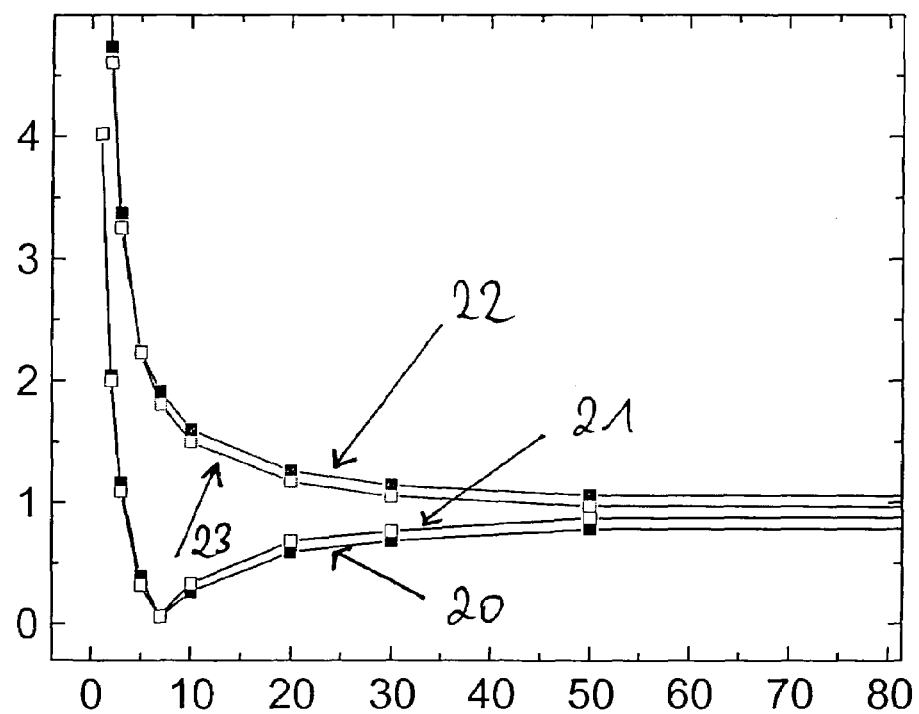
FIG. 1 shows simulation curves for the angle error of a layer system according to the spin valve principle, operating on the basis of the GMR effect, as a function of the strip width and as a function of the angle between the longitudinal direction of this strip and the direction of the magnetization of the reference layer in the case of a first magnetic field.
Figure 2:
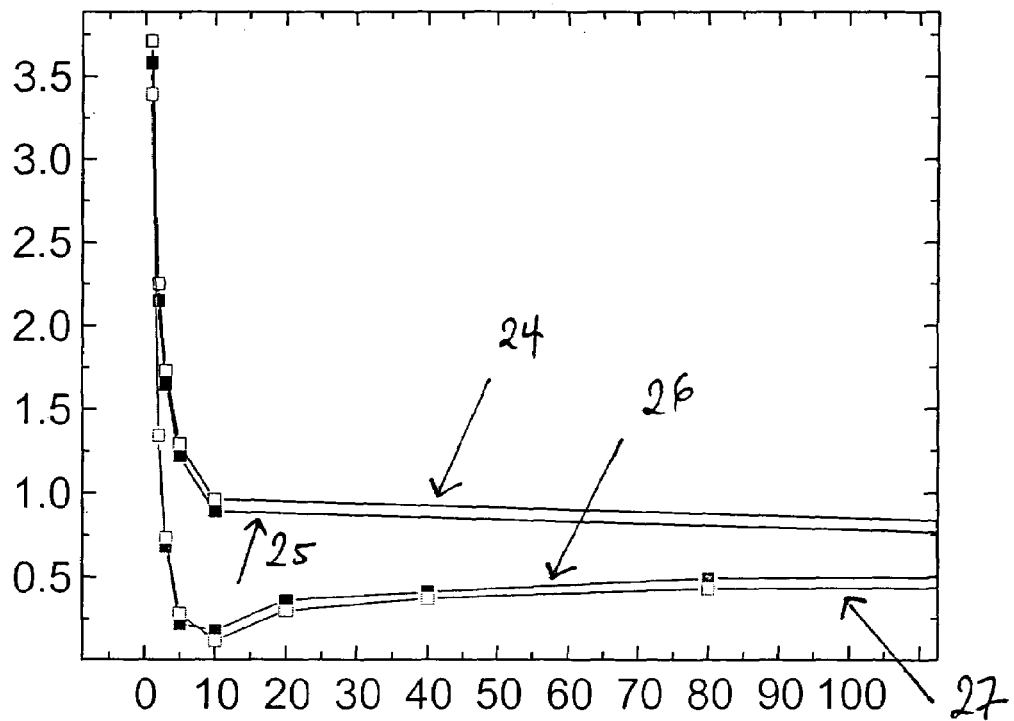
FIG. 2 shows simulation curves analogous to FIG. 1 for a second magnetic field which is stronger than the first magnetic field shown in FIG. 1.

For layer system 10 according to FIG. 3 and FIG. 4, calculations were carried out with inclusion of the shape anisotropy and the AMR error, respectively, which are represented in FIG. 1 and FIG. 2.

In detail, in FIG. 1, the width of striated layer system 10 is plotted on the x axis in μm in the range from 0 μm to 80 μm. The calculated maximum angle error over all possible angles of an external magnetic field of sensor element 5 is plotted on the y axis in degrees between 00, i.e., the ideal case, and 5°. Moreover, an external magnetic field having a field strength of 12 kA/m, corresponding to 15 mT, was applied.

First of all, FIG. 1 shows a first simulation 20 based on layer system 10 according to FIG. 3 and FIG. 4. In this context, the external magnetic field has the intensity of 12 kA/m and is rotated completely once by 360° over layer system 10 with respect to the component of the field strength of this outer magnetic field lying in the plane of layer system 10.

The outer magnetic field is oriented in such a way that it lies as completely as possible in the plane of layer system 10, which is constructed as explained above.

Moreover, in simulation 20, in the absence of the outer magnetic field, the direction of magnetization of reference layer 35 is aligned perpendicularly to the longitudinal direction of striated layer system 10, i.e., the corresponding angle is 90° or 270°. Furthermore, only intrinsic effects which lead to the plotted angle error were taken into account in simulation 20, additional magnetoresistive effects, i.e., primarily a so-called AMR error, having been left out of consideration. This AMR error occurs in ferromagnetic layers and exhibits a $\cos^2$-dependency on the direction of the magnetization and the current direction or strip direction. It overlays the GMR effect and, as a rule, has a level of 5% to 30% of the GMR effect.

One recognizes in first simulation 20 that, for a strip width of approximately 7 μm, in the case of the predefined magnetic field, which in practice is predefined in a fixed manner by the existing transducer magnets, given a predefined setting of the angle between the longitudinal direction of striated layer system 10 and the direction of magnetization of reference layer 35 as explained, a minimal angle error occurs which lies nearly at 0°.

FIG. 1 further shows a second simulation 21 in which, in addition to simulation 20, the indicated AMR error has also been taken into account. The AMR error does not lead to a relevant change of second simulation 21 compared to first simulation 20.

This being so, in this case as well, given the predefined magnetic field and the predefined orientation of the direction of magnetization of reference layer 35 perpendicularly to the longitudinal direction of the striated layer system, it is best to select a strip width of approximately 7 μm in view of minimizing the angle error.

A third simulation 22, which corresponds to first simulation 20, is also plotted in FIG. 1; in simulation 22, however, the direction of magnetization of reference layer 35 in the case of the given magnetic field has been set to be parallel to the longitudinal direction of the striated layer system, i.e., at an angle of 0° or 180°. Once more, the AMR error was initially disregarded in third simulation 22. If it is taken into account, fourth simulation 23 results, given otherwise identical parameters as those for simulation 22.

It can be inferred from simulations 22, 23 that there is no minimum for the maximum angle error as a function of the strip width.

All in all, it is deducible from FIG. 1 that, regardless of the width of the strips of striated layer system 10, it is always more favorable, in the case of the given magnetic field of 12 kA/m, to select the direction of magnetization of reference layer 35 to be perpendicular to the longitudinal direction of the striated layer system, since regardless of the strip width, the maximum angle error is then always smaller than if the angle of 0° to 180° is selected. In particular, it is apparent that the selection of an angle of 90° or 270° between the direction of magnetization of reference layer 35 in the absence of an outer magnetic field and the longitudinal direction of striated layer system 10 always leads to a lower maximum angle error than other angles.

Moreover, it may be inferred from FIG. 1 that, in addition to the matching of this angle to the respective outer magnetic field of defined field strength, there is also an optimal strip width which further minimizes the maximum angle error. This effect is even greater than the effect obtained by the selection of the angle between the direction of magnetization of the reference layer and the longitudinal direction of striated layer system 10.

FIG. 2 shows a situation largely analogous to FIG. 1; in FIG. 2, however, the external magnetic field has a field strength of 24 kA/m (corresponding to 30 mT). Here, as well, the maximum angle error is again plotted in degrees as a function of the width of the strips of layer system 10 in μm corresponding to FIG. 1.

In this context, the maximum angle error once again refers to the angle error maximally occurring in response to rotation of the external magnetic field by 360° in the plane of layer system 10.

Plotted in FIG. 2 is, first of all, a fifth simulation 24 in connection with a layer system 10 according to FIGS. 3 and 4, the simulation assuming an external magnetic field of 24 kA/m and an angle between the direction of magnetization of the reference layer in the absence of the outer magnetic field and the longitudinal direction of striated layer system 10 of 90° or 270°. The GMR error, as well as the AMR error, which is produced by shape anisotropy contributions, was taken into consideration in fifth simulation 24. A sixth simulation 25, otherwise corresponding to the fifth simulation, omits this AMR error.

When comparing FIG. 2 and FIG. 1, it is evident that, in contrast to simulations 20, 21, simulations 24, 25 show no minimum of the maximum angle error, which, moreover, considered absolutely, is also even greater.

Also plotted in FIG. 2 is an eighth simulation 27 which differs from fifth simulation 24 only in that the direction of magnetization of reference layer 35 has been selected to be parallel to the longitudinal direction of striated layer system 10, i.e., at an angle of 0° or 180°. In addition to the GMR error, the AMR error has also been taken into account in eighth simulation 27, while a seventh simulation 26, given otherwise identical simulation conditions, in comparison to eighth simulation 27, omits this AMR error.

Here, one can see that, on one hand, in the case of the predefined magnetic field, given an angle between the direction of magnetization of the reference layer in the absence of the outer magnetic field and the longitudinal direction of striated layer system 10 of 0° or 180°, the maximum angle error leads to a perceptibly reduced angle error compared to a corresponding angle of 90° or 270°. In this respect, the situation, given the assumed magnetic field according to FIG. 2, is exactly the other way around to that in the case of FIG. 1. Moreover, one then observes that the maximum angle error may be further reduced by selecting an optimum strip width which lies at approximately 10 μm in the example according to FIG. 2.

The strategy resulting from the analysis of the simulations according to FIG. 1 or 2 is therefore: First of all, the outer magnetic field is predefined from a work interval to which the sensor element is subject during operation. After that, one searches for the angle between the magnetization direction of reference layer 35 in the absence of the outer magnetic field and the longitudinal direction of striated layer system 10 which leads to the smallest maximum angle error. The strip width is also optimized in such a way that a further reduced maximum angle error is obtained, i.e., one searches for the optimum strip width for the smallest angle error.

Finally, it is also inferable from the simulations according to FIGS. 1 and 2 that the angle between the direction of magnetization of the reference layer in the absence of the outer magnetic field and the longitudinal direction of the striated layer system may be selected at 0° and 180°, or 90° and 270°, respectively. Moreover, the inclusion of the AMR error does not lead to substantial changes of the result in the search for a minimum angle error.

In conclusion, it should be stressed again that the provision of conducting layer 11 in the form of short-circuit bars according to FIG. 3 leads to a substantial reduction of the maximum angle error. It should also be stressed that, in the case of artificial anti-ferromagnet 40, second fixed layer 33 is somewhat thicker than first fixed layer 35, i.e., the reference layer. In addition, the layer construction according to FIG. 4 having the indicated materials and layer thicknesses is particularly beneficial with respect to the elucidated minimization of the angle error.

What is claimed is:

1. A magnetoresistive sensor element, comprising:
  a magnetoresistive layer system that is at least regionally striated when viewed from the top and operates on the basis of the giant magneto resistance effect according to the spin valve principle, wherein the magnetoresistive layer system includes a reference layer having a direction of magnetization substantially uninfluenced by a direction of an external magnetic field acting on the reference layer;
  wherein the magnetoresistive layer system provides a measuring signal that varies as a function of a measurement angle between a component of a field strength of the external magnetic field, said component lying in the plane of the layer system, and the direction of magnetization of the reference layer, and wherein the measurement angle is able to be ascertained from the measuring signal;
  wherein, when viewed from the top of the magnetoresistive layer system, a first angle between the direction of magnetization of the reference layer in the absence of the external magnetic field and the longitudinal direction of the magnetoresistive layer system is set in such a way that, in response to an influence of the external magnetic field having a defined field strength that is selected from a predefined work interval, an angle error of the magnetoresistive layer system is substantially minimal, the angle error being defined as the maximum difference between: a) the angle between the component of the field strength of the external magnetic field lying in the plane of the magnetoresistive layer system and the direction of magnetization of the reference layer when a negligibly weak external magnetic field is present; and b) the measurement angle, ascertained from the measuring signal, between the component, lying in the plane of the layer system, of the field strength of the external magnetic field over all possible directions of the external magnetic field, and the direction of magnetization of the reference layer.

2. The magnetoresistive sensor element according to claim 1, wherein, when viewed from the top of the magnetoresistive layer system, the first angle between the direction of magnetization of the reference layer in the absence of the external magnetic field and the longitudinal direction of the magnetoresistive layer system, as well as the width of the magnetoresistive layer system, are adjusted so that the first angle and the width of the magnetoresistive layer system are matched to one another in such a way that, in response to an influence of the external magnetic field having a defined field strength that is selected from a predefined work interval, the angle error of the magnetoresistive layer system as a function of the first angle, the defined field strength of the external magnetic field and the width of the magnetoresistive layer system is substantially minimal.

3. The magnetoresistive sensor element according to claim 1, wherein the field strength of the external magnetic field is selected from a work interval of 0.8 kA/m to 80 kA/m, and wherein the angle between the direction of magnetization of the reference layer in the absence of the external magnetic field and the longitudinal direction of the magnetoresistive layer system is one of approximately 0°, 90°, 180°, and 270°.

4. The magnetoresistive sensor element according to claim 1, wherein the width of the magnetoresistive layer system is between 1 µm and 100 µm.

5. The magnetoresistive sensor element according to claim 1, wherein the magnetoresistive layer system includes an artificial anti-ferromagnet having a first fixed layer, a second fixed layer, and an intermediate layer positioned between the first fixed layer and the second fixed layer, wherein the first fixed layer is the reference layer.

6. The magnetoresistive sensor element according to claim 5, wherein the first fixed layer is made of a first ferromagnetic material, the second fixed layer is made of a second ferromagnetic material, and the intermediate layer is made of a non-magnetic material.

7. The magnetoresistive sensor element according to claim 6, wherein the thickness of the first fixed layer is approximately 0.2 nm to 0.8 nm less than the thickness of the second fixed layer.

8. The magnetoresistive sensor element according to claim 6, wherein the second fixed layer is positioned adjacent to an anti-ferromagnetic layer.

9. The magnetoresistive sensor element according to claim 6, wherein the first fixed layer is adjacent to a metallic layer including copper, and wherein the metallic layer is positioned adjacent to a detection layer that has a magnetization direction that is always at least approximately parallel to the direction of the component of the field strength of the external magnetic field, said component lying in the plane of the layer system.

10. The magnetoresistive sensor element according to claim 9, wherein the detection layer includes at least a first sublayer and a second sublayer, wherein the first sublayer includes CoFe alloy and is positioned adjacent to the metallic layer including copper, and wherein the second sublayer is made of a NiFe alloy.

11. The magnetoresistive sensor element according to claim 8, wherein the anti-ferromagnetic layer has a thickness of 20 nm to 40 nm, the second fixed layer has a thickness of 2 nm to 4 nm, the intermediate layer has a thickness of 0.6 nm to 0.8 nm, the first fixed layer has a thickness of 1 nm to 3.5 nm, the metallic layer has a thickness of 1 nm to 4 nm, the first sublayer has a thickness of 0.5 nm to 2 nm, and the second sublayer has a thickness of 1.5 nm to 5 nm.

12. The magnetoresistive sensor element according to claim 2, wherein when viewed from the top of the magnetoresistive layer system, the magnetoresistive layer system has a meander pattern including a plurality of first strip sections extending substantially in parallel, and wherein the directions of magnetization of the reference layers of the plurality of first strip sections being oriented substantially parallel to one another.

13. The magnetoresistive sensor element according to claim 12, wherein the magnetoresistive layer system includes second strip parts which extend at least regionally perpendicular to the first strip sections, and wherein one of: a) the second strip parts are formed from a material exhibiting good electrical conductivity; and b) a conducting layer exhibiting good electrical conductivity is provided to extend in parallel to the second strip parts and electrically short-circuit the second strip parts.

14. A method for minimizing an angle error of a magnetoresistive sensor element, comprising:
providing a magnetoresistive layer system that is at least regionally striated when viewed from the top and operates on the basis of the giant magneto resistance effect according to the spin valve principle, wherein the magnetoresistive layer system includes a reference layer having a direction of magnetization substantially uninfluenced by a direction of an external magnetic field acting on the reference layer, wherein the magnetoresistive layer system provides a measuring signal that varies as a function of a measurement angle between a component of a field strength of the external magnetic field, said component lying in the plane of the layer system, and the direction of magnetization of the reference layer, and wherein the measurement angle is able to be ascertained from the measuring signal; and
setting, when viewed from the top of the magnetoresistive layer system, a first angle between the direction of magnetization of the reference layer in the absence of the external magnetic field and the longitudinal direction of the magnetoresistive layer system in such a way that, in response to an influence of the external magnetic field having a defined field strength that is selected from a predefined work interval, the angle error of the magnetoresistive layer system is substantially minimal, the angle error being defined as the maximum difference between: a) the angle between the component of the field strength of the external magnetic field lying in the plane of the magnetoresistive layer system and the direction of magnetization of the reference layer when a negligibly weak external magnetic field is present; and b) the measurement angle, ascertained from the measuring signal, between the component, lying in the plane of the layer system, of the field strength of the external magnetic field over all possible directions of the external magnetic field, and the direction of magnetization of the reference layer.

15. The method according to claim 14, wherein, when viewed from the top of the magnetoresistive layer system, the first angle between the direction of magnetization of the reference layer in the absence of the external magnetic field and the longitudinal direction of the magnetoresistive layer system, as well as the width of the magnetoresistive layer system, are adjusted so that the first angle and the width of the magnetoresistive layer system are matched to one another in such a way that, in response to an influence of the external magnetic field having a defined field strength that is selected from a predefined work interval, the angle error of the magnetoresistive layer system as a function of the first angle, the defined field strength of the external magnetic field and the width of the magnetoresistive layer system is substantially minimal.

* * * * *

UNITED STATES PATENT AND TRADEMARK OFFICE
CERTIFICATE OF CORRECTION

PATENT NO.        : 7,095,596 B2
APPLICATION NO.   : 10/535475
DATED             : August 22, 2006
INVENTOR(S)       : Schmollngruber et al.

It is certified that error appears in the above-identified patent and that said Letters Patent is hereby corrected as shown below:

Column 2, line 63, change "sensor Elements" to --sensor elements--

Column 9, line 15, change "according to claim 1" to --according to claim 3--

Signed and Sealed this

Fourth Day of December, 2007

JON W. DUDAS
*Director of the United States Patent and Trademark Office*